United States Patent
Akahoshi et al.

(10) Patent No.: US 9,502,455 B2
(45) Date of Patent: Nov. 22, 2016

(54) OPTICAL APPARATUS HAVING RESIN ENCASED STACKED OPTICAL AND SEMICONDUCTOR DEVICES

(71) Applicant: Panasonic Corporation, Osaka (JP)

(72) Inventors: Toshitaka Akahoshi, Tokyo (JP); Hiroki Yamashita, Kanagawa (JP); Shigefumi Dohi, Kanagawa (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/721,010

(22) Filed: May 26, 2015

(65) Prior Publication Data

US 2015/0255500 A1   Sep. 10, 2015

Related U.S. Application Data

(63) Continuation of application No. PCT/JP2013/006078, filed on Oct. 11, 2013.

(30) Foreign Application Priority Data

Nov. 30, 2012   (JP) .................................. 2012-262535

(51) Int. Cl.
*H01L 27/146* (2006.01)
*H01L 31/0224* (2006.01)
(Continued)

(52) U.S. Cl.
CPC ......... *H01L 27/14636* (2013.01); *H01L 24/19* (2013.01); *H01L 24/97* (2013.01); *H01L 27/1469* (2013.01); *H01L 27/14618* (2013.01); *H01L 27/14683* (2013.01); *H01L 27/14685* (2013.01); *H01L 31/024* (2013.01); *H01L 31/022408* (2013.01);

(Continued)

(58) Field of Classification Search
CPC .................. H01L 27/14636; H01L 27/14618; H01L 31/022408
See application file for complete search history.

(56) References Cited

U.S. PATENT DOCUMENTS

| 2001/0050717 A1 | 12/2001 | Yamada et al. |
| 2003/0128442 A1 | 7/2003 | Tanaka et al. |

(Continued)

FOREIGN PATENT DOCUMENTS

| JP | 6-204442 | 7/1994 |
| JP | 2001-358997 | 12/2001 |

(Continued)

OTHER PUBLICATIONS

International Search Report of PCT application No. PCT/JP2013/006078 dated Dec. 17, 2013.

*Primary Examiner* — Kevin Parendo
(74) *Attorney, Agent, or Firm* — McDermott Will & Emery LLP

(57) ABSTRACT

A downsized, highly reliable optical apparatus is stably and easily manufactured with high productivity. The optical apparatus includes: an optical device having a principal surface including an optical unit; a transparent member disposed facing the optical unit; a semiconductor device disposed above a back surface of the optical device and electrically connected to the optical device, the back surface being opposite the principal surface; and a resin member provided in a region adjacent to the optical device and the semiconductor device above a surface of the transparent member, the surface of the transparent member facing the optical device.

12 Claims, 11 Drawing Sheets

(51) Int. Cl.
*H01L 23/00* (2006.01)
*H01L 31/024* (2014.01)

(52) U.S. Cl.
CPC ........... *H01L 2224/16225* (2013.01); *H01L 2924/12041* (2013.01); *H01L 2924/12042* (2013.01); *H01L 2924/15788* (2013.01)

(56) References Cited

U.S. PATENT DOCUMENTS

| | | |
|---|---|---|
| 2004/0056340 A1 | 3/2004 | Jobetto |
| 2004/0164981 A1 | 8/2004 | Fujita et al. |
| 2006/0065964 A1* | 3/2006 | Ohsumi .................. 257/690 |
| 2006/0171698 A1 | 8/2006 | Ryu et al. |
| 2007/0267712 A1 | 11/2007 | Fujita et al. |
| 2008/0079105 A1* | 4/2008 | Chang et al. ............ 257/434 |
| 2008/0277752 A1 | 11/2008 | Fujita et al. |
| 2008/0308928 A1* | 12/2008 | Chang et al. ............ 257/723 |
| 2009/0053856 A1 | 2/2009 | Ohsumi |
| 2009/0140125 A1 | 6/2009 | Takayama |
| 2009/0166831 A1* | 7/2009 | Chang et al. ............ 257/680 |
| 2009/0211793 A1 | 8/2009 | Nakano et al. |
| 2010/0295178 A1 | 11/2010 | Ishihara et al. |
| 2011/0279717 A1 | 11/2011 | Wakiyama et al. |
| 2012/0194719 A1 | 8/2012 | Churchwell et al. |
| 2012/0220065 A1* | 8/2012 | Chuang et al. ............. 438/65 |

FOREIGN PATENT DOCUMENTS

| | | |
|---|---|---|
| JP | 2002-231916 | 8/2002 |
| JP | 2004-296453 | 10/2004 |
| JP | 2005-101484 | 4/2005 |
| JP | 2006-128625 | 5/2006 |
| JP | 2006-216935 | 8/2006 |
| JP | 4126389 B | 7/2008 |
| JP | 2009-182208 | 8/2009 |
| JP | 4713602 B | 6/2011 |
| JP | 2011-243612 | 12/2011 |
| WO | 2006/129460 | 12/2006 |

\* cited by examiner

OPTICAL APPARATUS HAVING RESIN ENCASED STACKED OPTICAL AND SEMICONDUCTOR DEVICES

BACKGROUND OF THE INVENTION

1. Field of the Invention

The present disclosure relates to an optical apparatus and a method for manufacturing the optical apparatus.

2. Description of the Related Art

In response to the demand for downsized smartphones and tablet devices, recent years have seen more and more demand for downsized solid-state imaging devices including a charge coupled device (CCD) or a complementary metal-oxide semiconductor that are mounted on the smartphones and the tablet devices.

With conventional ceramic packages and resin mold packages, it is hard to take a measure that responds to the demand for downsizing. Solid-state imaging apparatuses that allow compact packaging have been proposed (see patent literatures (PTLs) 1, 2, and 3, for example).

FIG. 10 illustrates a cross-sectional configuration of a solid-state imaging apparatus disclosed in PTL 1. A solid-state imaging apparatus disclosed in PTL 1 includes substrate 202 and electronic component 203 provided on first surface 202a of substrate 202 or inside substrate 202. The solid-state imaging apparatus further includes connection electrode 204 electrically connected to electronic component 203 and provided on first surface 202a of substrate 202, first through-hole 205 penetrating substrate 202 in the thickness direction of substrate 202 in such a way as to reach a back surface of connection electrode 204, and penetrating electrode 206 provided inside first through-hole 205 in such a way as to extend from inside first through-hole 205 to above second surface 202b of substrate 202. Furthermore, the solid-state imaging apparatus includes wiring electrode 207 provided on second surface 202b of substrate 202 and electrically connected to penetrating electrode 206 on second surface 202b of substrate 202, and insulating layer 208 provided on second surface 202b of substrate 202 in such a way as to cover a surface of wiring electrode 207.

FIG. 11 illustrates a cross-sectional configuration of a solid-state imaging apparatus disclosed in PTL 2. In the solid-state imaging apparatus disclosed in PTL 2, image sensor module 301 of a wafer level used in a digital device or the like includes the following constituents. Image sensor module 301 includes image sensor 340, optical filter 310 that removes light having a specific wavelength from light incident on image sensor 340, and glass layer 320 attached to optical filter 310 to protect filter-coating layer 310a. Furthermore, image sensor module 301 includes a plurality of pad electrodes 330 formed on a back surface of glass layer 320 and electrically connected to image sensor 340, redistribution pads 342 disposed in a region on the back of image sensor 340, and solder balls 370 disposed in a region on the back of image sensor 340 and electrically connected to pad electrodes 330. The image sensor is covered from outside with resin layer 350 including a plurality of via holes 352 that are filled or plated with an electrically conductive material so that pad electrodes 330 and redistribution pads 342 are electrically connected to each other.

FIG. 12 illustrates a cross-sectional configuration of a solid-state imaging apparatus disclosed in PTL 3. In the solid-state imaging apparatus disclosed in PTL 3, a plurality of silicon substrates 401 each having a photoelectric conversion device region on a lower surface are separated from each other and adhere onto transparent adhesive layer 432 on glass substrate 409 having a size corresponding to a plurality of semiconductor packages. In a region around the lower surface of each silicon substrate 401 and in a region surrounding silicon substrate 401, connecting wire 407 that is connected to connecting pad 431 made from silicon is provided. An insulating film, a distribution wire, columnar electrode 412, encapsulating film 413, and solder ball 414 are sequentially formed and then cut between silicon substrates 401, resulting in a plurality of semiconductor packages each including a photoelectric conversion device region.

CITATION LIST

Patent Literature

PTL 1: Japanese Patent No. 4,713,602
PTL 2: Japanese Unexamined Patent Publication No. 2006-216935
PTL 3: Japanese Patent No. 4,126,389

SUMMARY OF THE INVENTION

However, the method disclosed in PTL 1 is complicated in terms of manufacture because it is necessary to provide a step of manufacturing an electrode that penetrates the substrate, and further provide steps of manufacturing an insulating layer, a seed layer, and an electrically conductive layer. Furthermore, there are design constraints that wiring and transistor devices shall not be located below electrodes provided with penetrating electrodes, and therefore an imaging device chip requires a special design. This is a problem in that the design cost increases and in that changes in specification cannot be responded to with flexibility. Moreover, even an out-die image sensor, which is a defective product, is packaged in the production process, meaning that a cost for packaging the out-die image sensor is included in a cost for packaging a good-die image sensor, which is a non-defective product. This is a problem in that the production cost increases.

In order to solve the problems attributed to the penetrating electrode in the substrate disclosed in PTL 1, the resin member is disposed in a region around the imaging device and the penetrating electrode is formed in the resin member in PTL 2 and PTL 3. However, this leads to an increase in chip size and an increase in package size when the number of pixels is increased and a noise correction function, a signal processing function, and the like are added in order to improve the functions of the imaging device. If the resin member disposed in the region around the imaging device is set to have a reduced volume so that the increase in package size is reduced, the area of close contact between the resin member and the region around the glass element and the imaging device is reduced, which may cause the resin member to fall off or the like trouble. This degraded reliability of connection to the penetrating electrode is a problem.

An object of the present disclosure is to provide a downsized, highly reliable optical apparatus that can be stably and easily manufactured with high productivity by solving the above problems.

In order to achieve the above-described object, the optical apparatus according to one or more exemplary embodiments is structured to include, above a transparent member, stacked layers of an optical device having an optical function (an optical chip) and a semiconductor device including peripheral circuitry and the like (a semiconductor chip), encapsulated by resin surrounding these chips.

Specifically, an optical apparatus according to an aspect of the present disclosure includes: an optical device having a principal surface including an optical unit; a transparent member disposed facing the optical unit; a semiconductor device disposed above a back surface of the optical device and electrically connected to the optical device, the back surface being opposite the principal surface; and a resin member provided in a region adjacent to the optical device and the semiconductor device above a surface of the transparent member, the surface of the transparent member facing the optical device.

In the optical apparatus according to an aspect of the present disclosure, the resin member may cover a side surface of the optical device, at least a part of the back surface of the optical device, and a side surface of the semiconductor device.

In the optical apparatus according to an aspect of the present disclosure, the resin member may cover a side surface of the optical device, a side surface of the semiconductor device, and a part of a surface of the semiconductor device, the surface of the semiconductor device being opposite a circuit surface of the semiconductor device.

The optical apparatus according to an aspect of the present disclosure may further include: a first electrode included in the principal surface of the optical device; and an external electrode terminal provided above a surface of the resin member and electrically connected to the first electrode, the surface of the resin member being on an opposite side of the resin member from the transparent member.

The optical apparatus according to an aspect of the present disclosure may include the following constituents. Specifically, the optical apparatus according to an aspect of the present disclosure further includes: a first electrode included in the principal surface of the optical device; a second electrode, a third electrode, and a first wiring element provided on the surface of the transparent member that faces the optical device, the second electrode facing the first electrode, the third electrode being located in a more peripheral region of the optical apparatus than the second electrode, the first wiring element electrically connecting the second electrode and the third electrode; a first protruding electrode (i) disposed between the first electrode and the second electrode and (ii) electrically connecting the first electrode and the second electrode; a first penetrating electrode (i) provided in a more peripheral region of the resin member than the optical device and the semiconductor device, (ii) electrically connected to the optical device, and (iii) having one end connected to the third electrode; and a second wiring element and an external electrode terminal provided above a surface of the resin member, the second wiring element being connected to another end of the first penetrating electrode, the surface of the resin member being on an opposite side of the resin member from the transparent member.

In this case, the external electrode terminal may be provided at a position that does not overlap with the semiconductor device as seen in a plan view of the principal surface of the optical device.

In the optical apparatus according to an aspect of the present disclosure, the optical device may be a solid-state imaging device.

In the optical apparatus according to an aspect of the present disclosure, the semiconductor device may be disposed in alignment with a central portion of the transparent member.

The optical apparatus according to an aspect of the present disclosure may include the following constituents. Specifically, the optical apparatus according to an aspect of the present disclosure further includes: a fourth electrode, a fifth electrode, and a third wiring element provided on the back surface of the optical device, the fifth electrode being located in a more peripheral region of the optical apparatus than the fourth electrode, the third wiring element electrically connecting the fourth electrode and the fifth electrode; a second protruding electrode via which the semiconductor device is flip-chip bonded to the fourth electrode; and a second penetrating electrode provided in the resin member and having one end connected to the fifth electrode.

In the optical apparatus according to an aspect of the present disclosure, in the resin member, a portion that covers a region adjacent to the optical device and a portion that covers a region adjacent to the semiconductor device may be made from the same material.

When the optical apparatus according to an aspect of the present disclosure includes a first protruding electrode, in the resin member, a portion that covers a region adjacent to the optical device and the semiconductor device and a portion that covers a region adjacent to the first protruding electrode may be made from the same material.

The optical apparatus according to an aspect of the present disclosure may further include a heat dissipating member (i) provided on the back surface of the optical device in the resin member and (ii) penetrating the resin member.

In this case, the heat dissipating member may have a diameter larger than a diameter of the first penetrating electrode.

A method for manufacturing an optical apparatus according to an aspect of the present disclosure includes: forming, on a transparent member having a plate shape and including a plurality of device regions, a first wiring element having an electrode that is to be disposed on each of the plurality of device regions; disposing, above the plurality of device regions of the transparent member, a plurality of optical devices each having a principal surface including an optical unit, the principal surface facing the electrode of the first wiring element; disposing a semiconductor device above a back surface of each of the optical devices, the back surface being opposite the principal surface; forming a resin member by covering a side surface of each of the optical devices, at least a part of the back surface of each of the optical devices, and a side surface of the semiconductor device with resin; forming a first penetrating electrode through the resin member from a surface of the resin member, the first penetrating electrode being electrically connected to the electrode of the first wiring element, the surface of the resin member being on an opposite side of the resin member from the transparent member; forming a second wiring element and an external electrode terminal above the surface of the resin member that is on the opposite side of the resin member from the transparent member, the second wiring element having an electrode, the external electrode terminal being electrically connected to the second wiring element; and cutting the transparent member and the resin member into pieces for each of the device regions.

In the method for manufacturing an optical apparatus according to an aspect of the present disclosure, the forming of a first penetrating electrode may include forming a heat dissipating member through the resin member from the surface of the resin member that is on the opposite side of the resin member from the transparent member, the heat dissipating member being connected to the back surface of each of the optical devices.

The method for manufacturing an optical apparatus according to an aspect of the present disclosure may include the following steps. Specifically, the method includes forming a third wiring element having an electrode on the back surface of each of the optical devices before the disposing of a plurality of optical devices, and in the disposing of a semiconductor device, the semiconductor device is disposed so as to be electrically connected to the electrode of the third wiring element, and the forming of a first penetrating electrode includes forming a second penetrating electrode through the resin member from the surface of the resin member that is on the opposite side of the resin member from the transparent member, the second penetrating electrode being electrically connected to the electrode of the third wiring element on each of the optical devices.

A method for manufacturing an optical apparatus according to an aspect of the present disclosure includes: forming, on a transparent member having a plate shape and including a plurality of device regions, a first wiring element having an electrode that is to be disposed on each of the plurality of device regions; disposing, above the plurality of device regions of the transparent member, a plurality of optical devices each having a principal surface including an optical unit, the principal surface facing the electrode of the first wiring element; disposing a semiconductor device above a back surface of each of the optical devices, the back surface being opposite the principal surface; forming a resin member by covering a side surface of each of the optical devices, a side surface of the semiconductor device, and at least a part of a surface of the semiconductor device with resin, the surface of the semiconductor device being opposite a circuit surface of the semiconductor device; forming a first penetrating electrode through the resin member from a surface of the resin member, the first penetrating electrode being electrically connected to the electrode of the first wiring element, the surface of the resin member being on an opposite side of the resin member from the transparent member; forming a second wiring element and an external electrode terminal above the surface of the resin member that is on the opposite side of the resin member from the transparent member, the second wiring element having an electrode, the external electrode terminal being electrically connected to the second wiring element; and cutting the transparent member and the resin member into pieces for each of the device regions.

The method for manufacturing an optical apparatus according to an aspect of the present disclosure may further include forming a protruding electrode on the electrode of the first wiring element and forming a dam in a region on the transparent member between the forming of a first wiring element and the disposing of a plurality of optical devices, the dam being for blocking the resin from flowing onto the optical unit, the region on the transparent member being adjacent to a region facing the optical unit.

In this case, the dam and the protruding electrode may be made from the same material.

According to the optical apparatus and the method for manufacturing the optical apparatus in one or more exemplary embodiments disclosed herein, it is possible to provide a downsized, highly reliable optical apparatus that can be stably and easily manufactured with high productivity.

DETAILED DESCRIPTION OF THE PREFERRED EMBODIMENTS

First Embodiment

An optical apparatus according to a first embodiment is described with reference to FIG. 1.

Figure 1:
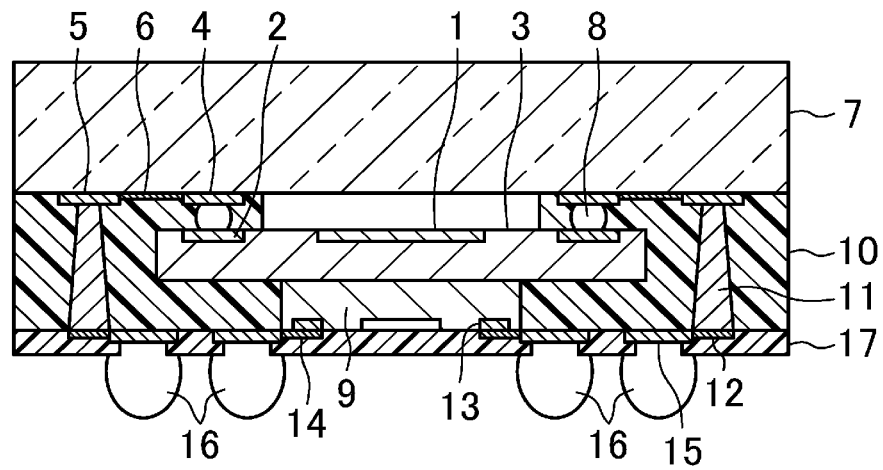
FIG. 1 is a cross-sectional view illustrating an optical apparatus according to a first embodiment.

As illustrated in FIG. 1, an optical apparatus according to the present embodiment includes: imaging device (a solid-state imaging device) 3 as an example of an optical device having a principal surface including imaging region 1 as an example of an optical unit and first electrode 2; transparent member 7 disposed facing imaging device 3, which is made from a glass material or resin that transmits light; semiconductor device 9 disposed above a back surface of imaging device 3, which is opposite the principal surface, and electrically connected to imaging device 3, and having a circuit surface on an opposite side of semiconductor device 9 from imaging device 3; and resin member 10 provided in a region adjacent to imaging device 3 and semiconductor device 9 above a surface of transparent member 7 that faces imaging device 3.

Second electrode 4, third electrode 5, and first wiring element 6 are provided on the surface of transparent member 7 that faces the principal surface of imaging device 3. Third electrode 5 is disposed in a more peripheral region of the optical apparatus than second electrode 4. First wiring element 6 electrically connects second electrode 4 and third electrode 5. First electrode 2 of imaging device 3 is electrically connected to second electrode 4 provided on transparent member 7, through protruding electrode 8 which is an example of a first protruding electrode. First electrode 2 and second electrode 4 face each other. Protruding electrode 8 is preferably made from a material that is capable of electrical connection, such as gold (Au) or a solder material.

A plurality of device electrodes 13 are provided in the circuit surface of semiconductor device 9.

As a method of bonding semiconductor device 9 and imaging device 3, either surface activated silicon-to-silicon bonding or a dice bonding technique using a die bonding material in paste or sheet form may be used. There are no constraints on the position of semiconductor device 9 on the back surface of imaging device 3, that is, semiconductor device 9 can be placed at any position on the back surface of imaging device 3. Note that semiconductor device 9 is desirably disposed in alignment with a central position of the optical apparatus, that is, a central portion of transparent member 7.

On the surface of transparent member 7 that faces imaging device 3, resin member 10 is provided in the region adjacent to imaging device 3 and semiconductor device 9. Resin member 10 covers a side surface of imaging device 3, at least a part of the back surface of imaging device 3, and a side surface of semiconductor device 9. Thus, in resin member 10, a portion that covers a region adjacent to imaging device 3 and semiconductor device 9 and a portion that covers a region adjacent to protruding electrode 8 are made from the same material. Furthermore, in resin member 10, a portion that covers a region adjacent to imaging device 3 and a portion that covers a region adjacent to semiconductor device 9 are made from the same material. The resin for resin member 10 is blocked in a region adjacent to imaging region 1 in the principal surface of imaging device 3 so as not to cover imaging region 1. An exemplary method of such blocking will be described later.

A plurality of penetrating electrodes 11 are provided in resin member 10. The plurality of penetrating electrodes 11 pass through a region that is lateral to or surrounds imaging device 3 and semiconductor device 9, and each have one end connected to third electrode 5 provided on transparent member 7. Specifically, penetrating electrode 11, which is an example of the first penetrating electrode electrically connected to imaging device 3, is provided in a more peripheral region of resin member 10 than imaging device 3 and semiconductor device 9, and one of ends of penetrating electrode 11 is connected to third electrode 5. Note that a sentence herein such as "two electrically conductive elements are connected" means "two electrically conductive elements are in direct contact," and a sentence herein such as "two electrically conductive elements are electrically connected" includes not only a state where "two electrically conductive elements are in direct contact," but also a state where "a different electrically conductive element is located between two electrically conductive elements." Penetrating electrode 11 can be made from an electrically conductive material such as copper (Cu) or a solder material. Other electrically conductive materials than the stated examples may also be used without limitation.

Second wiring element 12, device wiring element 14, electrode 15, and external electrode terminal 16 are provided above a surface of resin member 10 that is on an opposite side of resin member 10 from transparent member 7. Second wiring element 12 is connected to the other end of each of the plurality of penetrating electrodes 11. Device wiring element 14 is connected to device electrode 13 of semiconductor device 9. Electrode 15 is connected to second wiring element 12. External electrode terminal 16 is formed on electrode 15 and is, for example, in the shape of a ball. Thus, external electrode terminal 16 is provided above the surface of resin member 10 that is on the opposite side of resin member 10 from transparent member 7, and is electrically connected to first electrode 2.

Protective resin layer 17 is provided in a region on the circuit surface of semiconductor device 9 and in a region on the surface of resin member 10 that is on the opposite side of resin member 10 from transparent member 7, except regions where second wiring element 12, device wiring element 14, and external electrode terminal 16 are provided.

Thus, in the optical apparatus according to the first embodiment, imaging device (imaging chip) 3 has an imaging function, and semiconductor device (semiconductor chip) 9 has a function of processing a signal from imaging device 3, a function of controlling imaging device 3, and the like function, which means that the optical apparatus according to the first embodiment includes two separate chips. The two separate chips are stacked in layers. Resin member 10 covers the two stacked chips together. With this structure, the area of resin member 10 in contact with imaging device 3 and semiconductor device 9 can be sufficient in a region adjacent to penetrating electrode 11. Therefore, as an advantageous effect, it becomes less likely that resin member 10 is peeled off from the both chips. Thus, it is possible to easily provide a downsized optical apparatus without sacrificing reliability of connection between penetrating electrode 11 and third electrode 5 and connection between penetrating electrode 11 and second wiring element 12, that is, without disconnection of penetrating electrode 11, for example.

Furthermore, damage from thermal distortion or other causes can be avoided when semiconductor device 9, which includes a delicate circuit unit formed by a fine and detailed process intended for higher functionality, is disposed in a central portion of the optical apparatus (package) where stress generated by thermal distortion or other causes is low. With this, it is possible to easily provide a highly-reliable compact package in which a highly-functional optical device is mounted.

Furthermore, in the optical apparatus according to the present embodiment, a circuit unit which is conventionally located around the imaging region is divided into circuit elements which are disposed on the side on which external electrode terminal 16 is disposed. This makes it possible to configure a system in which imaging device 3 is less susceptible to the thermal impact of the circuit unit. Therefore, a decrease in sensitivity of imaging device 3 can be easily reduced.

First Variation of First Embodiment

Figure 2:
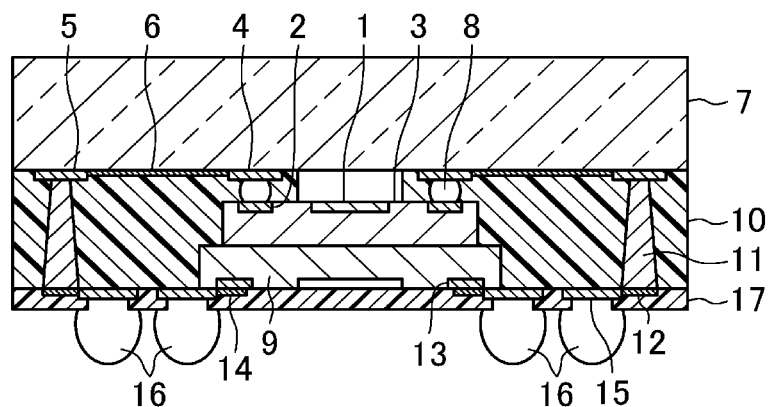
FIG. 2 is a cross-sectional view illustrating an optical apparatus according to a first variation of a first embodiment.

FIG. 2 illustrates a cross-sectional configuration of an optical apparatus according to a first variation of the first embodiment.

In the first variation as illustrated in FIG. 2, even in the case where semiconductor device 9 is larger than imaging device 3 in the optical apparatus as seen in a plan view, the area of resin member 10 in contact with imaging device 3 and semiconductor device 9 can be sufficient in a region adjacent to penetrating electrode 11. In this variation, resin member 10 covers a side surface of imaging device 3, a side surface of semiconductor device 9, and a part of a surface of semiconductor device 9 that is opposite a circuit surface of semiconductor device 9. Therefore, as an advantageous effect, it becomes less likely that resin member 10 is peeled off from the both chips, i.e., imaging device 3 and semiconductor device 9. As a result, it is possible to easily provide a downsized optical apparatus without sacrificing reliability of connection between penetrating electrode 11 and third electrode 5 and connection between penetrating electrode 11 and second wiring element 12, that is, without disconnection of penetrating electrode 11, for example.

Furthermore, damage from thermal distortion or other causes can be avoided when semiconductor device 9 including a circuit unit is disposed in a central portion of the optical apparatus where stress generated by thermal distortion or other causes is low.

Second Variation of First Embodiment

Figure 3:
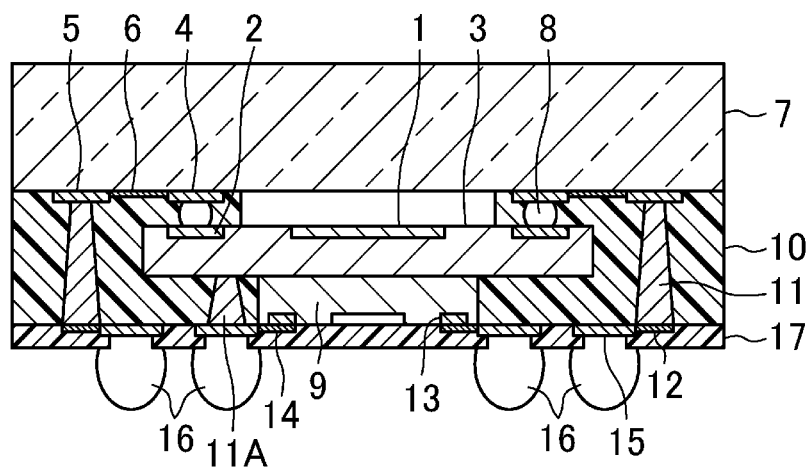
FIG. 3 is a cross-sectional view illustrating an optical apparatus according to a second variation of a first embodiment.

FIG. 3 illustrates a cross-sectional configuration of an optical apparatus according to a second variation of the first embodiment.

As illustrated in FIG. 3, the optical apparatus according to the second variation includes, in addition to penetrating electrode 11 penetrating resin member 10 from third electrode 5 disposed on transparent member 7, heat dissipating member 11A penetrating resin member 10 and having one end connected to the back surface of imaging device 3 and the other end connected to electrode 15 disposed on a back surface of resin member 10. In short, the optical apparatus according to the second variation includes heat dissipating member 11A provided on the back surface of imaging device 3 in resin member 10 and penetrating resin member 10. External electrode terminal 16 is provided on each of electrodes 15.

With this structure, it is possible to efficiently release heat from the back surface of imaging device 3 to outside the optical apparatus through electrode 15 and external electrode terminal 16. Thus, the optical apparatus has improved heat dissipation properties.

Penetrating electrode 11 and heat dissipating member 11A can be made from an electrically conductive material such as copper (Cu) or a solder material. Other electrically conductive materials than the stated examples may also be used without limitation. The heat dissipation properties can be higher when heat dissipating member 11A has a diameter larger than a diameter of penetrating electrode 11.

Third Variation of First Embodiment

Figure 4:
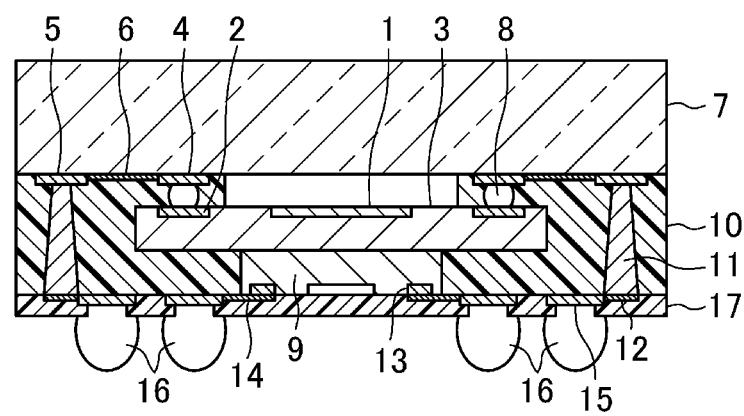
FIG. 4 is a cross-sectional view illustrating an optical apparatus according to a third variation of a first embodiment.

FIG. 4 illustrates a cross-sectional configuration of an optical apparatus according to a third variation of the first embodiment.

As illustrated in FIG. 4, in the optical apparatus according to the third variation, each external electrode terminal 16 is disposed in a region right below resin member 10 so as not to be located right below semiconductor device 9. In short, external electrode terminal 16 is provided at a position that does not overlap with semiconductor device 9 as seen in a plan view of the principal surface of imaging device 3. With this, strain and stress due to a change in temperature are reduced because of a small difference in coefficient of thermal expansion between resin member 10 and a mounting substrate which is usually made from an organic material. Consequently, deterioration of external electrode terminal 16 can be slowed down, and thus it is possible to easily provide a compact package with external electrode terminal 16 reliably connected to electrode 15 or an electrode on the mounting substrate side.

Although one semiconductor device 9 is disposed on the back surface of imaging device 3 in the present embodiment and the variations of the present embodiment, this is not the only example. For example, even if the structure illustrated in FIG. 1 has two semiconductor devices 9 in parallel on the back surface of imaging device 3, the same or like effects as with the first embodiment can be obtained.

Furthermore, even if semiconductor devices 9 are stacked in layers on the back surface of imaging device 3, the same or like effects as with the first embodiment and the variations of the first embodiment can be obtained.

Manufacturing Method According to First Embodiment

A method for manufacturing an optical apparatus according to the first embodiment is described with reference to FIG. 5A to FIG. 5D and FIG. 6A to FIG. 6E. Note that the following describes a method for manufacturing an optical apparatus including, in a region on the transparent member that is adjacent to a region facing the imaging region, a dam that blocks the resin for the resin member from flowing onto the imaging region.

Figure 5A:
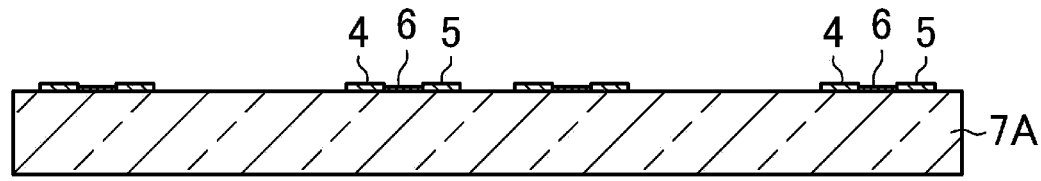
FIG. 5A is a cross-sectional view illustrating an optical apparatus according to a first embodiment in a step of a manufacturing method therefor.

First, as illustrated in FIG. 5A, second electrode 4 and third electrode 5 are formed on transparent member 7A having a plate shape and including a plurality of device regions corresponding to respective optical apparatuses. In more details, a seed metal layer made from titanium tungsten (TiW), aluminum (Al), copper (Cu), nickel (Ni), or the like is formed on the entire surface of transparent member 7A by physical vapor deposition (PVD) such as sputtering. The seed metal layer is then patterned into electrodes by lithography and etching. Subsequently, a main metal layer is formed on the patterned seed metal layer by plating, resulting in second electrode 4, third electrode 5, and first wiring element 6. At this time, regions in which dams are to be formed in a subsequent process can be masked with a resist film or the like so that second electrode 4 and third electrode 5 will be of a greater height than the dams. The plating is typically forming gold (Au) on nickel (Ni). For forming the main metal layer, sputtering may be used, but electrolytic plating is more advantageous for mass production.

Figure 5B:
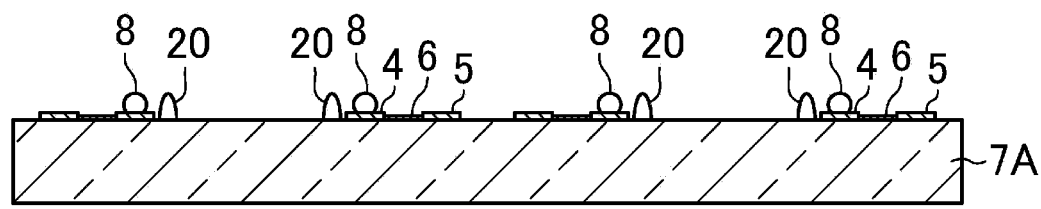
FIG. 5B is a cross-sectional view illustrating an optical apparatus according to a first embodiment in a step of a manufacturing method therefor.

Next, as illustrated in FIG. 5B, dam 20 is formed in a region that will face a region adjacent to the imaging region in the imaging device. At the same time, each protruding electrode 8 for connecting to the imaging device is formed on each second electrode 4. In sum, protruding electrode 8 is formed on an electrode of first wiring element 6, and dam 20 for blocking the resin from flowing onto imaging region 1 is formed in a region on transparent member 7A that is adjacent to a region facing imaging region 1. Dam 20 and protruding electrode 8 are desirably formed at the same time using the same material. For example, for forming dam 20 and protruding electrode 8, Cu or Ni may be plated with a solder material, or a stud bump may be formed using Au. Furthermore, protruding electrode 8 may be formed by stud bumping or the like method on the first electrode in the imaging device.

Figure 5C:
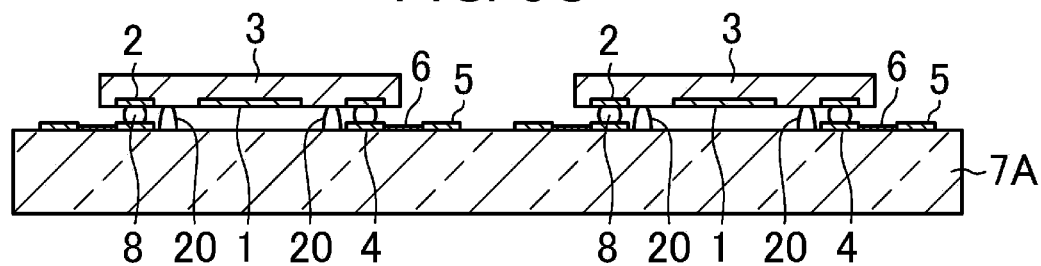
FIG. 5C is a cross-sectional view illustrating an optical apparatus according to a first embodiment in a step of a manufacturing method therefor.

Next, imaging devices 3 each having a principal surface including imaging region 1 are disposed above the device regions of transparent member 7 in such a way that the principal surface faces the electrode of first wiring element 6. Specifically, as illustrated in FIG. 5C, imaging device 3 is connected to transparent member 7A by flip-chip bonding. At this time, protruding electrode 8 on second electrode 4 and first electrode 2 of imaging device 3 are connected to each other. It is possible that, as imaging device 3 to be mounted, only non-defective imaging device 3 is selected and bonded. This allows a reduction in production cost. Furthermore, at this point in time, an under-fill material may be provided in a more peripheral region than dam 20 in the region where imaging device 3 and transparent member 7A face each other. With this, it is possible to select a material suitable for protection of each of imaging device 3 and a connecter formed of protruding electrode 8.

Figure 5D:
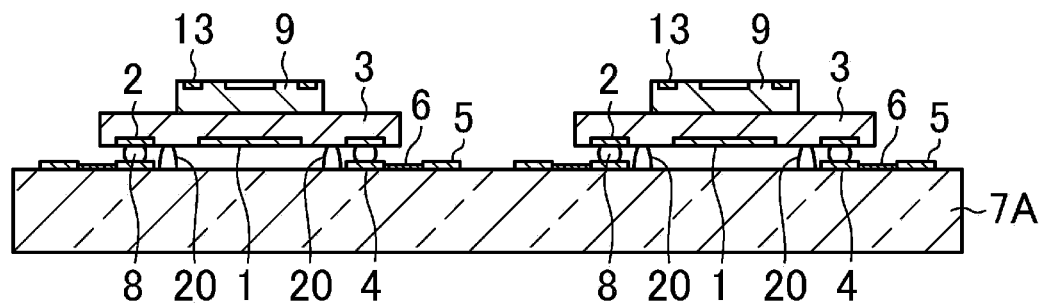
FIG. 5D is a cross-sectional view illustrating an optical apparatus according to a first embodiment in a step of a manufacturing method therefor.

Next, semiconductor device 9 is disposed on the back surface of imaging device 3 which is opposite the principal surface. Specifically, as illustrated in FIG. 5D, semiconductor device 9 is bonded to the back surface of imaging device 3 in such a way that a surface of semiconductor device 9 which is opposite the circuit surface of semiconductor device 9 faces the back surface of imaging device 3. As a method of bonding semiconductor device 9 onto the back surface of imaging device 3, either surface activated silicon-to-silicon bonding or a dice bonding technique using a die bonding material in paste or sheet form may be used as mentioned above. There are no constraints on the position of semiconductor device 9 on the back surface of imaging device 3, that is, semiconductor device 9 can be placed at any position on the back surface of imaging device 3. Note that semiconductor device 9 is desirably disposed in alignment with a central position of the device region (the optical apparatus).

Next, a side surface of imaging device 3, at least a part of the back surface of imaging device 3, and a side surface of semiconductor device 9 are covered with resin 10A, resulting in a resin member. Specifically, as illustrated in FIG. 6 Resin 10A collectively covers regions above a principal surface of transparent member 7A that are located between the principal surface of transparent member 7A and imaging device 3 and located lateral to imaging device 3 and semiconductor device 9. Exemplary methods of filling the regions with resin 10A are compression molding, transfer molding, and a filling method in which resin 10A is applied as an island and expanded by capillary action, from among which an appropriate method can be selected according to viscosity or wettability of resin 10A. Furthermore, in the manufacturing method according to the present embodiment, dam 20 is formed between imaging region 1 and protruding electrode 8 serving as a connecter between imaging device 3 and transparent member 7A. With this, it is possible to prevent resin 10A from entering imaging region 1. With the manufacturing method according to the present embodiment, dam 20 remains even after manufacture. This is the case with other embodiments in which dam 20 is provided with the same structure as that in the present embodiment.

Note that in the process of forming the resin member, the side surface of imaging device 3, the side surface of semiconductor device 9, and a part of the surface of semiconductor device 9 that is opposite the circuit surface of semiconductor device 9 may be covered with resin 10A. By doing so, it is possible to provide the above-described structure according to the first variation.

Resin 10A is, for example, insulating epoxy-based resin containing silica or the like filler.

Figure 6A:
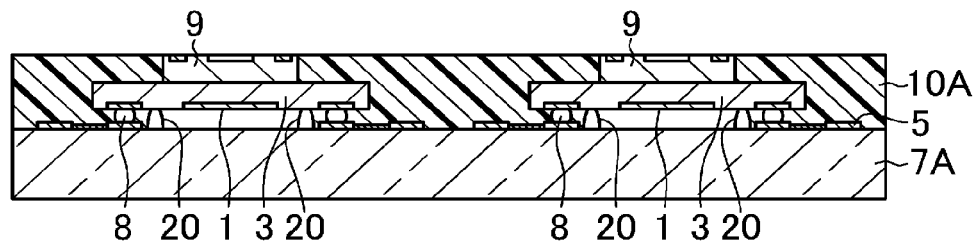
FIG. 6A is a cross-sectional view illustrating an optical apparatus according to a first embodiment in a step of a manufacturing method therefor.
Figure 6B:
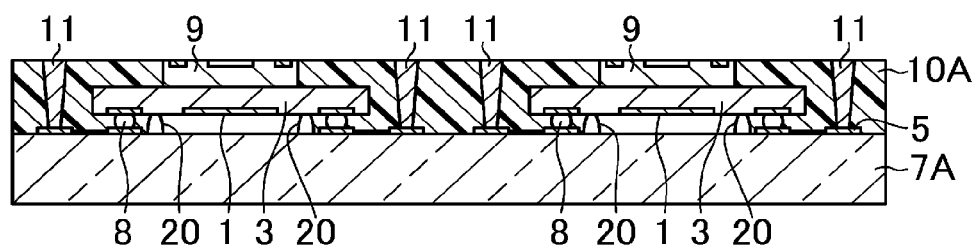
FIG. 6B is a cross-sectional view illustrating an optical apparatus according to a first embodiment in a step of a manufacturing method therefor.

Next, penetrating electrode 11 is formed as an example of the first penetrating electrode which penetrates a resin member (resin 10A) from the surface of the resin member that is on an opposite side of the resin member from transparent member 7A, and is electrically connected to first wiring element 6. Specifically, as illustrated in FIG. 6B, penetrating electrodes 11 are formed in resin 10A. Various methods are available for etching an opening in which penetrating electrode 11 is formed. For example, the opening is formed using a laser beam, the opening is formed by reactive ion etching (RIE), or a mask of photosensitive resin is provided which is then exposed to light.

Figure 6C:
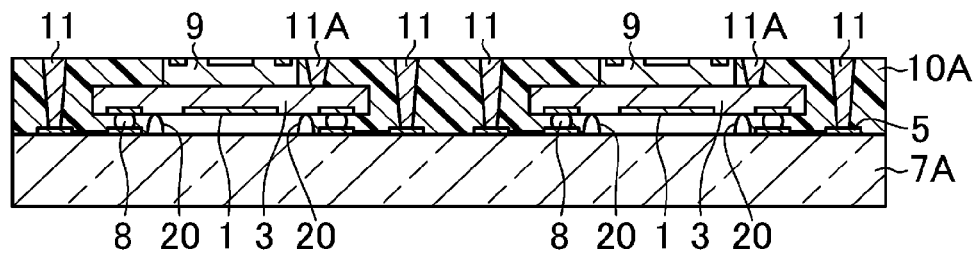
FIG. 6C is a cross-sectional view illustrating an optical apparatus according to a first embodiment in a step of a manufacturing method therefor.

At this time, in the process of forming penetrating electrodes 11, heat dissipating members 11A which are connected to the back surface of imaging device 3 may be formed as illustrated in FIG. 6C. In the process of forming penetrating electrode 11, heat dissipating member 11A which is connected to the back surface of imaging device 3 may be formed through the resin member (resin 10A) from the surface of the resin member that is on the opposite side of the resin member from transparent member 7A. By doing so, it is possible to provide the above-described structure according to the second variation.

Figure 6D:
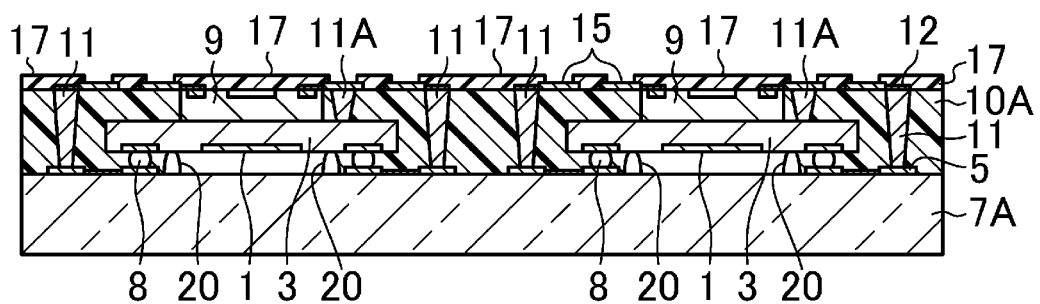
FIG. 6D is a cross-sectional view illustrating an optical apparatus according to a first embodiment in a step of a manufacturing method therefor.

Next, as illustrated in FIG. 6D, electrodes 15 are formed at predetermined positions on resin 10A and formed on heat dissipating members 11A. Subsequently, second wiring element 12 having an electrode is formed on the surface of the resin member (resin 10A) that is on the opposite side of the resin member from transparent material 7A. Specifically, second wiring element 12 is formed on penetrating electrode 11. Thereafter, protective resin layer 17 is formed on resin 10A in a region other than electrode 15, to insulate between adjacent electrodes 15 and second wiring elements 12 on the circuit surface.

Figure 6E:
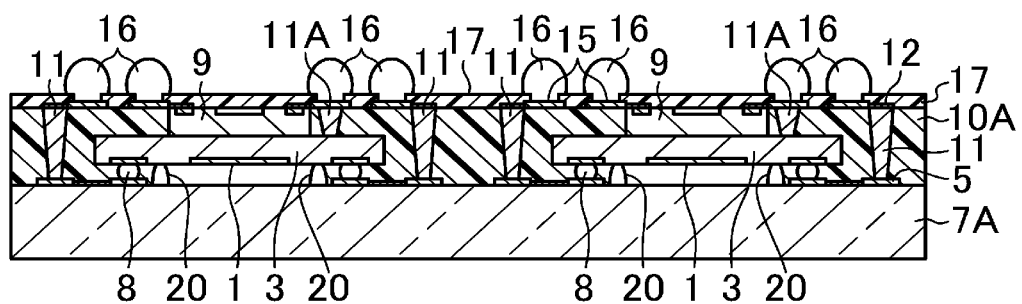
FIG. 6E is a cross-sectional view illustrating an optical apparatus according to a first embodiment in a step of a manufacturing method therefor.

Next, external electrode terminal 16 which is electrically connected to second wiring element 12 is formed above the surface of the resin member (resin 10A) that is on the opposite side of the resin member from transparent member 7A. Specifically, as illustrated in FIG. 6E, external electrode terminals 16 which are used for electrical connection with outside are formed on electrodes 15. External electrode terminals 16 can be arranged at regular intervals above the back surface of resin 10A. At this time, each external electrode terminal 16 is desirably disposed on resin 10A in such a way that external electrode terminal 16 does not overlap with a region where a circuit device is disposed on semiconductor device 9. In short, external electrode terminal 16 may be provided at a position that does not overlap with semiconductor device 9 as seen in a plan view of the principal surface of imaging device 3. By doing so, it is possible to provide the above-described structure according to the third variation.

Next, although not illustrated in the drawings, transparent member 7A and the resin member (resin 10A) are cut into pieces for each of the device regions. Specifically, resin 10A and transparent member 7A are diced into the pieces in such a way that each of the pieces includes one of the device regions, that is, a single optical apparatus. This dicing into pieces makes it possible to obtain a desired optical apparatus with transparent member 7 resulting from transparent member 7A as well as resin member 10 resulting from resin 10A.

Note that heat dissipating member 11A described as to the process of FIG. 6C does not always need to be formed, and the absence of heat dissipating member 11A can result in an optical apparatus having the structure illustrated in FIG. 1.

According to the manufacturing method described above, imaging device 3 including an imaging function and semiconductor device 9 including a peripheral circuitry function are separately provided, and at least these two chips are stacked in layers which are then collectively covered with resign material 10A. This allows resin 10A in which penetrating electrode 11 has been formed to have a sufficient area in contact with imaging device 3 and semiconductor device 9. Therefore, resin 10A is less likely to be peeled off from imaging device 3 and semiconductor device 9, and thus it is possible to easily provide a downsized optical apparatus without sacrificing reliability of connection to penetrating electrode 11.

Furthermore, damage from thermal distortion or other causes can be avoided when semiconductor device 9, which includes a delicate circuit unit formed by a fine and detailed process intended for higher functionality, is disposed in a central portion of the package where stress generated by thermal distortion or other causes is low. With this, it is possible to easily provide a highly-reliable compact package in which a highly-functional optical device is mounted.

Furthermore, external electrode terminal 16 can be disposed so as not to overlap with semiconductor device 9 as seen from above in a plan view of the principal surface of transparent member 7A. With this, strain and stress due to a change in temperature are reduced because of a small difference in coefficient of thermal expansion between resin 10A and a mounting substrate which is usually made from an organic material. Consequently, deterioration of external electrode terminal 16 can be slowed down, and thus it is possible to easily provide a compact package that has external electrode terminal 16 with reliable connection.

Second Embodiment

An optical apparatus according to a second embodiment is described with reference to FIG. 7.

Figure 7:
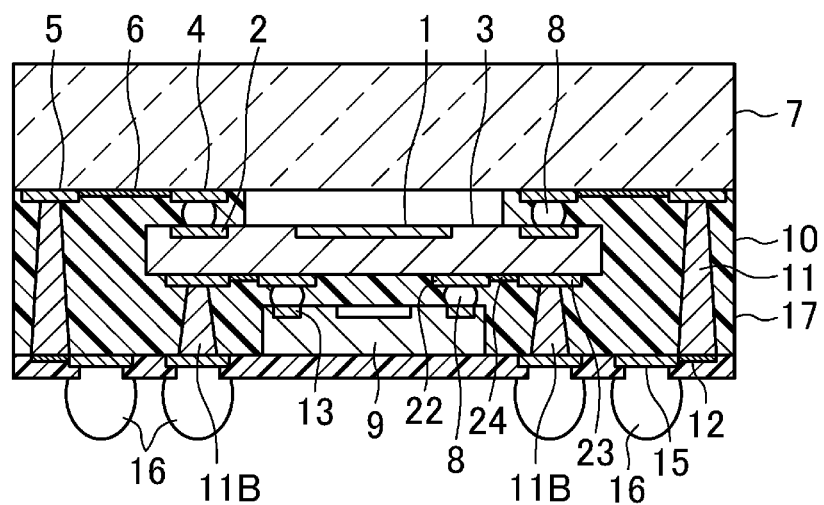
FIG. 7 is a cross-sectional view illustrating an optical apparatus according to a second embodiment.

Structural elements in FIG. 7 that are the same as structural elements illustrated in FIG. 1 share the same numerals and symbols, to simplify the descriptions.

As illustrated in FIG. 7, the optical apparatus according to the present embodiment includes fourth electrode 22, fifth electrode 23, and third wiring element 24, on a back surface of imaging device 3 which is an opposite surface of imaging device 3 from imaging region 1. Fifth electrode 23 is disposed in a more peripheral region of the optical apparatus than second electrode 22. Third wiring element 24 electrically connects fourth electrode 22 and fifth electrode 23. Semiconductor device 9 is flip-chip bonded to fourth electrode 22 via protruding electrode 8 on device electrode 13 which is an example of a second protruding electrode. Protruding electrode 8 is preferably made from a material that is capable of electrical connection, such as gold (Au) or a solder material, in the present embodiment as well.

Fifth electrode 23 of imaging device 3 is connected to one end of penetrating electrode 11B which is an example of a second penetrating electrode. Penetrating electrode 11B penetrates resin member 10. The other end of penetrating electrode 11B is connected to electrode 15 formed on the back surface of resin member 10. Penetrating electrodes 11 and 11B are made from an electrically conductive material such as copper (Cu) or a solder material. Other electrically conductive materials than the stated examples may also be used without limitation.

There are no constraints on the position of semiconductor device 9 above the back surface of imaging device 3, that is, semiconductor device 9 can be placed at any position above the back surface of imaging device 3. Note that semiconductor device 9 is desirably disposed in alignment with a central position of the optical apparatus, that is, a central portion of transparent member 7.

External electrode terminals 16 can be arranged at regular intervals above the back surface of resin member 10. At this time, each external electrode terminal 16 is desirably disposed on resin member 10 in such a way that external electrode terminal 16 does not overlap with semiconductor device 9 as seen in a plan view.

Thus, in the optical apparatus according to the second embodiment, imaging device (imaging chip) 3 has an imaging function, and semiconductor device (semiconductor chip) 9 has a function of processing a signal from imaging device 3, a function of controlling imaging device 3, and the like function, which means that the optical apparatus according to the second embodiment includes two separate chips. The two separate chips are stacked in layers. Resin member 10 covers the two stacked chips together. With this structure, the area of resin member 10 in contact with imaging device 3 and semiconductor device 9 can be sufficient in a region adjacent to penetrating electrode 11. Therefore, as an advantageous effect, it becomes less likely that resin member 10 is peeled off from the both chips. Thus, it is possible to easily provide a downsized optical apparatus without sacrificing reliability of connection between penetrating electrode 11 and third electrode 5 and connection between penetrating electrode 11 and second wiring element 12, that is, without disconnection of penetrating electrode 11, for example.

Furthermore, damage from thermal distortion or other causes can be avoided when semiconductor device 9, which includes a delicate circuit unit formed by a fine and detailed process intended for higher functionality, is disposed in a central portion of the optical apparatus (package) where stress generated by thermal distortion or other causes is low. With this, it is possible to easily provide a highly-reliable compact package in which a highly-functional optical device is mounted.

Each external electrode terminal 16 is disposed in a region right below resin member 10 so as not to be located right below semiconductor device 9. With this, strain and stress due to a change in temperature are reduced because of a small difference in coefficient of thermal expansion between resin member 10 and a mounting substrate which is usually made from an organic material. Consequently, deterioration of external electrode terminal 16 can be slowed down, and thus it is possible to easily provide a compact package that has external electrode terminal 16 with reliable connection.

Although one semiconductor device 9 is disposed above the back surface of imaging device 3 in the present embodiment, this is not the only example. For example, even if the structure illustrated in FIG. 7 has two or more semiconductor devices 9 in parallel above the back surface of imaging device 3, the same or like effects as with the present embodiment can be obtained.

Furthermore, even if semiconductor devices 9 are stacked in layers above the back surface of imaging device 3, the same or like effects as with the present embodiment can be obtained.

Manufacturing Method According to Second Embodiment

A method for manufacturing an optical apparatus according to the second embodiment is described with reference to FIG. 8A to FIG. 8D and FIG. 9A to FIG. 9D. Note that the following describes a method for manufacturing an optical apparatus including, in a region on the transparent member that is adjacent to a region facing the imaging region, a dam that blocks the resin for the resin member from flowing onto the imaging region.

Figure 8A:
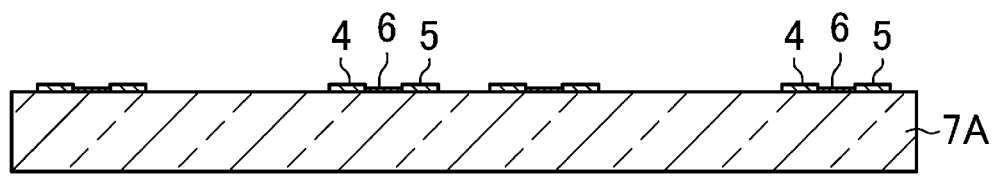
FIG. 8A is a cross-sectional view illustrating an optical apparatus according to a second embodiment in a step of a manufacturing method therefor.

First, as illustrated in FIG. 8A, second electrode 4 and third electrode 5 are formed on transparent member 7A having a plate shape and including a plurality of device regions corresponding to respective optical apparatuses. In more details, a seed metal layer made from TiW, Al, Cu, Ni, or the like is formed on the entire surface of transparent member 7A by PVD such as sputtering. The seed metal layer is then patterned into electrodes by lithography and etching. Subsequently, a main metal layer is formed on the patterned seed metal layer by plating, resulting in second electrode 4, third electrode 5, and first wiring element 6. At this time, regions in which dams are to be formed in a subsequent process can be masked with a resist film or the like so that second electrode 4 and third electrode 5 will be of a greater height than the dams. The plating is typically forming Au on Ni as described above. For forming the main metal layer, sputtering may be used, but electrolytic plating is more advantageous for mass production.

Figure 8B:
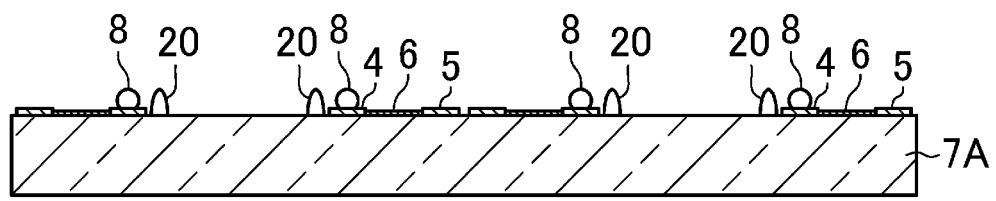
FIG. 8B is a cross-sectional view illustrating an optical apparatus according to a second embodiment in a step of a manufacturing method therefor.

Next, as illustrated in FIG. 8B, dam 20 is formed in a region that will face a region adjacent to the imaging region in the imaging device. At the same time, each protruding electrode 8 for connecting to the imaging device is formed on each second electrode 4. Dam 20 and protruding electrode 8 are desirably formed at the same time using the same material. For example, for forming dam 20 and protruding electrode 8, Cu or Ni may be plated with a solder material, or a stud bump may be formed using Au. Furthermore, protruding electrode 8 may be formed by stud bumping or the like method on the first electrode of the imaging device.

Figure 8C:
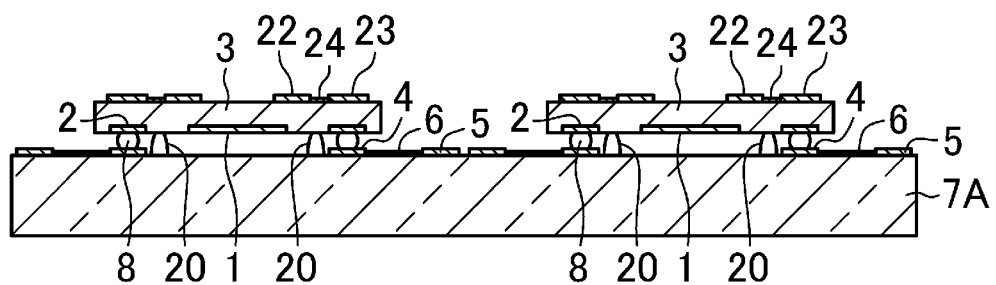
FIG. 8C is a cross-sectional view illustrating an optical apparatus according to a second embodiment in a step of a manufacturing method therefor.

Specifically, as illustrated in FIG. 8C, imaging device 3 is connected to transparent member 7A by flip-chip bonding. At this time, protruding electrode 8 on second electrode 4 on transparent member 7A and first electrode 2 of imaging device 3 are connected to each other. It is possible that, as imaging device 3 to be mounted, only non-defective imaging device 3 is selected and bonded. This allows a reduction in production cost.

Fourth electrode 22, fifth electrode 23, and third wiring element 24 are formed in advance on the back surface of imaging device 3. Fourth electrode 22 is for connecting to a semiconductor device to be mounted in a subsequent process. Third wiring element 24 connects fourth electrode 22 and fifth electrode 23. Specifically, third wiring element 24 having an electrode is formed on the back surface of each of optical devices 3 before the process of disposing optical devices 3 above imaging device 3. Fourth electrode 22, fifth electrode 23, and third wiring element 24 are formed in an apparatus in the form of a wafer that is to be cut into pieces for each semiconductor device. As with the case of second electrode 4, third electrode 5, and first wiring element 6 formed on transparent member 7A, fourth electrode 22, fifth electrode 23, and third wiring element 24 are formed as follows: a seed metal layer made from TiW, Al, Cu, Ni, or the like is formed by sputtering, and patterned by etching, on which a main metal layer is formed by plating.

Upon flip-chip bonding imaging device 3 above transparent member 7A, an under-fill material may be provided in a more peripheral region than dam 20 in the region above imaging device 3 that faces transparent member 7A. With this, it is possible to select a material suitable for protection of each of imaging device 3 and a connecting portion formed of protruding electrode 8.

Figure 8D:
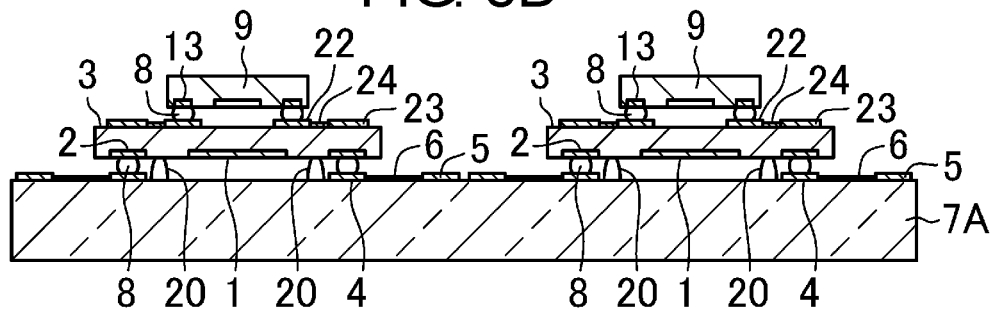
FIG. 8D is a cross-sectional view illustrating an optical apparatus according to a second embodiment in a step of a manufacturing method therefor.

Next, as illustrated in FIG. 8D, semiconductor device 9 is flip-chip bonded onto the back surface of imaging device 3 via protruding electrode 8. The bonding method is not particularly limited and may be Au—Au bonding, solder bonding, or any other bonding method. At this time, in the process of disposing semiconductor device 9 above the back surface of imaging device 3, semiconductor device 9 is disposed so as to be electrically connected to the electrode of third wiring element 24. There are no constraints on the position of semiconductor device 9 above the back surface of imaging device 3, that is, semiconductor device 9 can be placed at any position above the back surface of imaging device 3. Note that semiconductor device 9 is desirably disposed in alignment with a central position of the device region (the optical apparatus).

Next, as illustrated in FIG. 9 Resin 10A collectively covers regions above a principal surface of transparent member 7A that are located between the principal surface of transparent member 7A and imaging device 3 and located lateral to imaging device 3 and semiconductor device 9. Exemplary methods of filling the regions with resin 10A are compression molding, transfer molding, and a filling method in which resin 10A is applied in a dotted pattern and expanded by capillary action, from among which an appropriate method can be selected according to viscosity or wettability of resin 10A. Furthermore, in the manufacturing method according to the present embodiment, dam 20 is formed between imaging region 1 and protruding electrode 8 serving as a connecter between imaging device 3 and transparent member 7A. With this, it is possible to prevent resin 10A from entering imaging region 1.

At this time, the surface of resin 10A and the back surface of each semiconductor device exposed from resin 10A may be polished by backgrinding, chemical mechanical polishing (CMP), or the like technique so that the optical apparatus can be thinner.

Figure 9A:
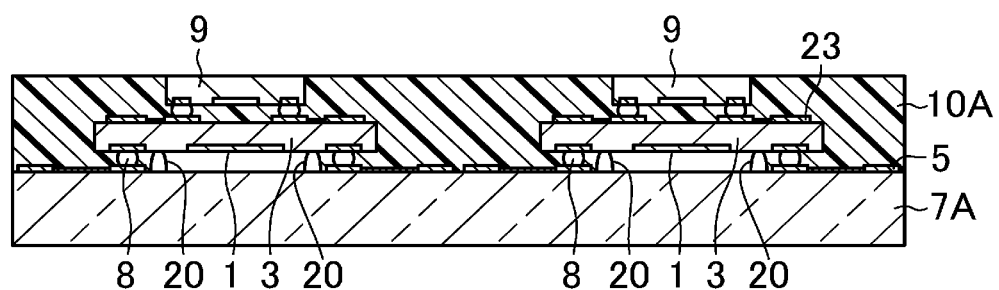
FIG. 9A is a cross-sectional view illustrating an optical apparatus according to a second embodiment in a step of a manufacturing method therefor.
Figure 9B:
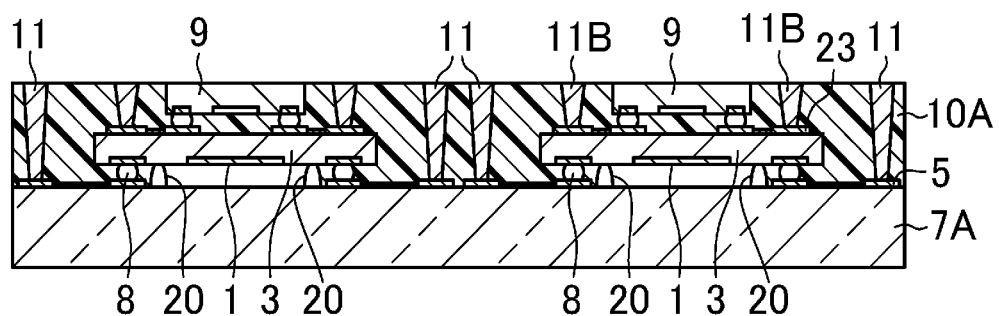
FIG. 9B is a cross-sectional view illustrating an optical apparatus according to a second embodiment in a step of a manufacturing method therefor.

Next, as illustrated in FIG. 9B, penetrating electrodes 11 and 11B are formed in resin 10A. At this time, penetrating electrode 11, which is connected to third electrode 5 on transparent member 7A, and penetrating electrode 11B, which is connected to fifth electrode 23 on the back surface of imaging device 3, are formed. Consequently, penetrating electrode 11B is formed as an example of the second penetrating electrode which penetrates the resin member (resin 10A) from the surface of the resin member (resin 10A) that is on the opposite side of the resin member from transparent member 7A, and is electrically connected to third wiring element 24 of imaging device 3. An etching method for an opening in which penetrating electrode 11, 11B is formed is, for example, to form an opening by a laser beam or RIE, or to provide a mask of photosensitive resin which is then exposed to light.

Figure 9C:
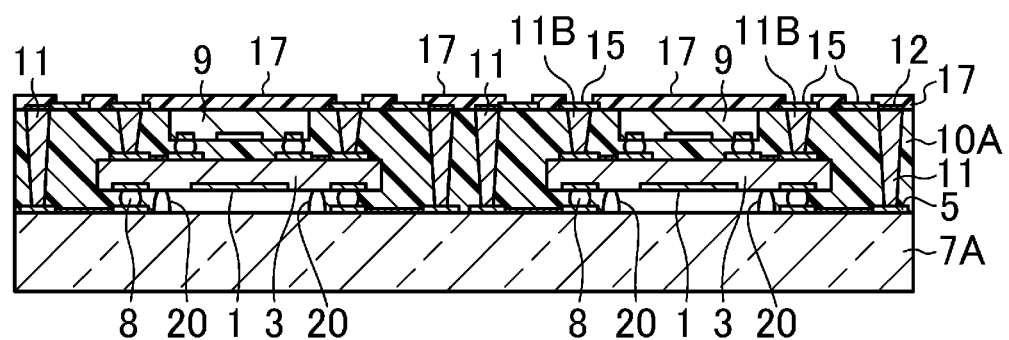
FIG. 9C is a cross-sectional view illustrating an optical apparatus according to a second embodiment in a step of a manufacturing method therefor.

Next, as illustrated in FIG. 9C, electrode 15 is selectively formed on resin 10A and on penetrating electrodes 11 and 11B. Thereafter, protective resin layer 17 is formed on resin 10A in a region other than electrode 15, to effect insulation.

Figure 9D:
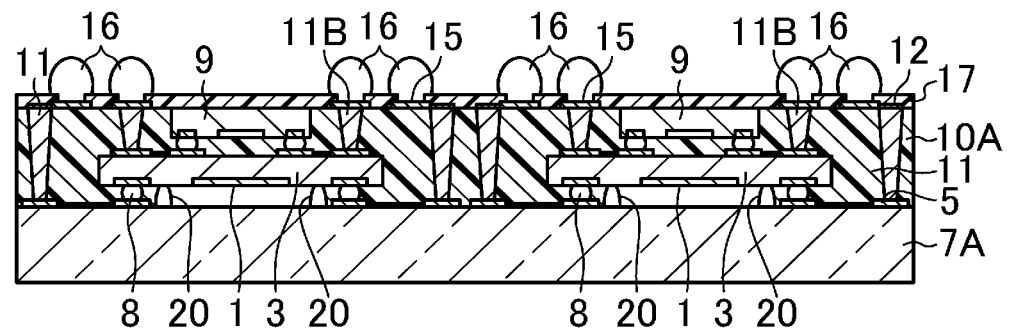
FIG. 9D is a cross-sectional view illustrating an optical apparatus according to a second embodiment in a step of a manufacturing method therefor.
Figure 10:
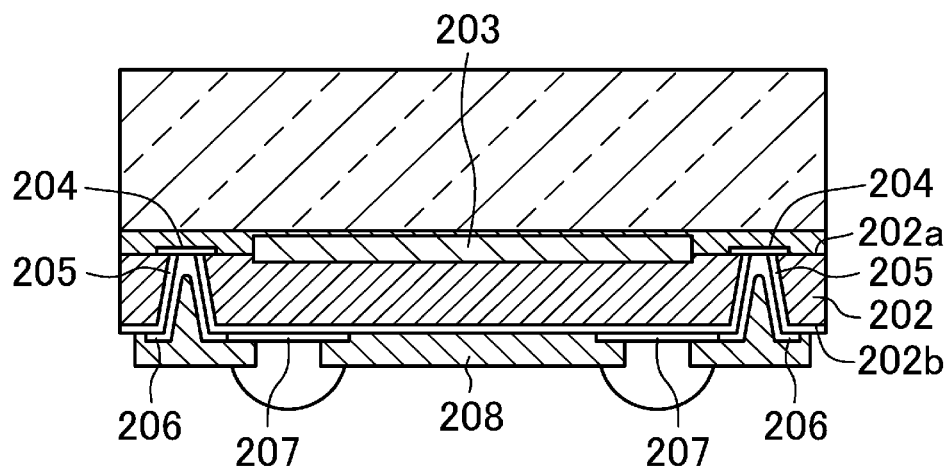
FIG. 10 is a cross-sectional view illustrating a solid-state imaging apparatus according to a conventional example.
Figure 11:
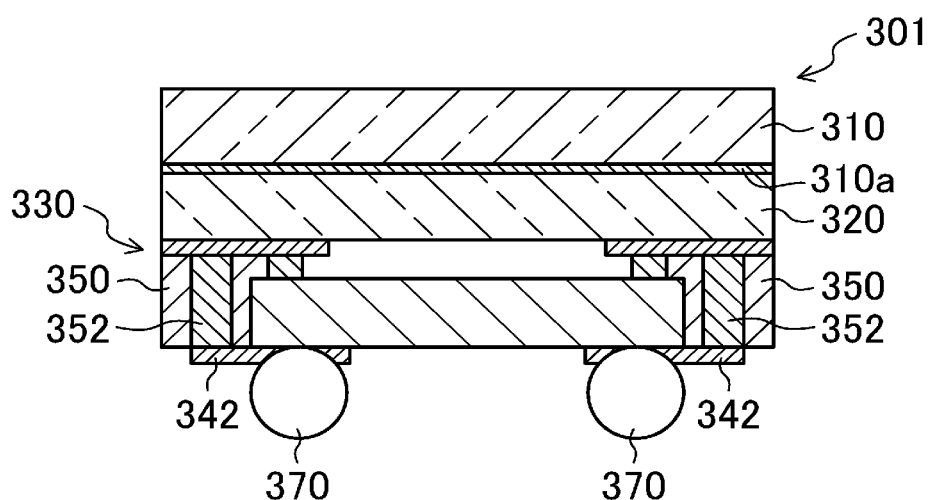
FIG. 11 is a cross-sectional view illustrating a solid-state imaging apparatus according to another conventional example.
Figure 12:
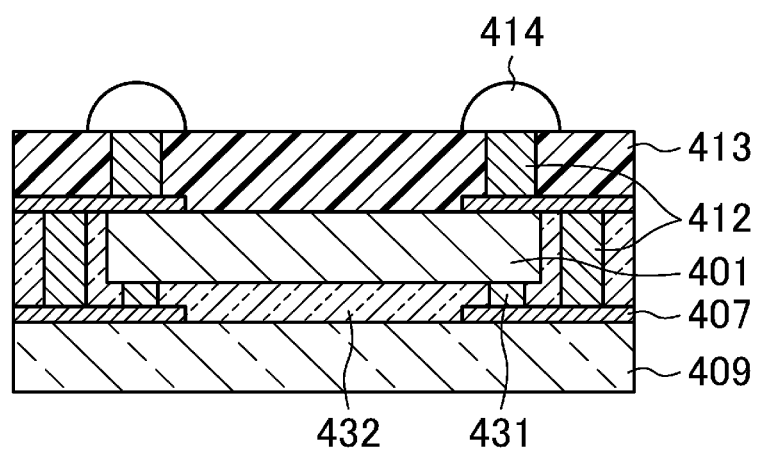
FIG. 12 is a cross-sectional view illustrating a solid-state imaging apparatus according to another conventional example.

Next, as illustrated in FIG. 9D, external electrode terminals 16 which are used for electrical connection with outside are formed on electrodes 15. External electrode terminals 16 can be arranged at regular intervals above the back surface of resin 10A. At this time, each external electrode terminal 16 is desirably disposed on resin 10A in such a way that external electrode terminal 16 does not overlap with a device surface of semiconductor device 9.

Next, although not illustrated in the drawings, resin 10A and transparent member 7A are diced into the pieces in such a way that each of the pieces includes one of the device regions, that is, a single optical apparatus. This dicing into pieces makes it possible to obtain a desired optical apparatus with transparent member 7 resulting from transparent member 7A as well as resin member 10 resulting from resin 10A.

According to the manufacturing method described above, imaging device 3 including an imaging function and semiconductor device 9 including a peripheral circuitry function are separately provided, and at least these two chips are stacked in layers which are then collectively covered with resign material 10A. With this structure, resin 10A in which penetrating electrode 11 has been formed can have a sufficient area that is in contact with imaging device 3 and semiconductor device 9. Therefore, resin 10A is less likely to be peeled off from imaging device 3 and semiconductor device 9, and thus it is possible to easily provide a downsized optical apparatus without sacrificing reliability of connection to penetrating electrode 11.

Furthermore, damage from thermal distortion or other causes can be avoided when semiconductor device 9, which includes a delicate circuit unit formed by a fine and detailed process intended for higher functionality, is disposed in a central portion of the package where stress generated by thermal distortion or other causes is low. With this, it is possible to easily provide a highly-reliable compact package in which a highly-functional optical device is mounted.

Furthermore, external electrode terminal 16 can be provided so as not to overlap with semiconductor device 9 as seen in a plan view from above the principal surface of transparent member 7A. With this, strain and stress due to a change in temperature are reduced because of a small difference in coefficient of thermal expansion between resin 10A and a mounting substrate which is usually made from an organic material. Consequently, deterioration of external electrode terminal 16 can be slowed down, and thus it is possible to easily provide a compact package that has external electrode terminal 16 with reliable connection.

Although the above embodiments and variations have been described citing an imaging device (a solid-state imaging device) as an example of an optical device, the optical device is not limited to the imaging device and may be a light-emitting device such as a light-emitting diode (LED) and a laser diode (LD), or may be a light-receiving device or other optical devices.

Means for achieving electrical connection between first electrode 2 provided in the principal surface of imaging device 3 and external electrode terminal 16 provided above the resin member is not limited to the means that uses penetrating electrode 11. For example, first wiring element 6 is formed extending to a lateral end of transparent member 7, second wiring element 12 is also formed extending to a lateral end of resin member 10, and a conductor for connecting first wiring element 6 and resin member 10 is formed on the lateral end of resin member 10. This structure allows the optical apparatus to have a smaller width and thus be reduced in size as compared to the structure in which third electrode 5 and penetrating electrode 11 are provided in a more peripheral region of the optical apparatus than imaging device 3.

Although the method for manufacturing the optical apparatus including the dam has been described as the above manufacturing method according to the first embodiment and the above manufacturing method according to the second embodiment, the dam does not always need to be provided. Depending on a distance between the transparent member and the imaging device, viscosity of the resin, or other factors, there can be cases where the resin does not enter onto the imaging region even without the dam.

INDUSTRIAL APPLICABILITY

The optical apparatus and the method for manufacturing the optical apparatus according to one or more exemplary embodiments in the present disclosure are useful for light-emitting or light-receiving devices that are provided in digital optical devices, for example.

What is claimed is:
1. An optical apparatus comprising:
an optical device having a principal surface including an optical unit;
a transparent member disposed facing the optical unit;
a semiconductor device disposed above a back surface of the optical device and electrically connected to the optical device, the back surface being opposite the principal surface;
a resin member provided in a region adjacent to the optical device and the semiconductor device above a surface of the transparent member, the surface of the transparent member facing the optical device;
a first electrode included in the principal surface of the optical device;
a second electrode, a third electrode, and a first wiring element provided on the surface of the transparent member that faces the optical device, the second electrode facing the first electrode, the third electrode being located in a more peripheral region of the optical apparatus than the second electrode, the first wiring element electrically connecting the second electrode and the third electrode;
a first protruding electrode (i) disposed between the first electrode and the second electrode and (ii) electrically connecting the first electrode and the second electrode;
a first penetrating electrode (i) provided in a more peripheral region of the resin member than the optical device and the semiconductor device, (ii) electrically connected to the optical device, and (iii) having one end connected to the third electrode; and
a second wiring element and an external electrode terminal provided above a surface of the resin member, the second wiring element being connected to another end of the first penetrating electrode, the surface of the resin member being on an opposite side of the resin member from the transparent member.

2. The optical apparatus according to claim 1, wherein the resin member covers a side surface of the optical device, at least a part of the back surface of the optical device, and a side surface of the semiconductor device.

3. The optical apparatus according to claim 1, wherein the resin member covers a side surface of the optical device, a side surface of the semiconductor device, and a part of a surface of the semiconductor device, the surface of the semiconductor device being opposite a circuit surface of the semiconductor device.

4. The optical apparatus according to claim 1, further comprising:
    a first electrode included in the principal surface of the optical device; and
    an external electrode terminal provided above a surface of the resin member and electrically connected to the first electrode, the surface of the resin member being on an opposite side of the resin member from the transparent member.

5. The optical apparatus according to claim 4, wherein the external electrode terminal is provided at a position that does not overlap with the semiconductor device as seen in a plan view of the principal surface of the optical device.

6. The optical apparatus according to claim 1, wherein in the resin member, a portion that covers a region adjacent to the optical device and the semiconductor device and a portion that covers a region adjacent to the first protruding electrode are made from the same material.

7. The optical apparatus according to claim 1, wherein the optical device is a solid-state imaging device.

8. The optical apparatus according to claim 1, wherein the semiconductor device is disposed in alignment with a central portion of the transparent member.

9. The optical apparatus according to claim 1, further comprising:
    a fourth electrode, a fifth electrode, and a third wiring element provided on the back surface of the optical device, the fifth electrode being located in a more peripheral region of the optical apparatus than the fourth electrode, the third wiring element electrically connecting the fourth electrode and the fifth electrode;
    a second protruding electrode via which the semiconductor device is flip-chip bonded to the fourth electrode; and
    a second penetrating electrode provided in the resin member and having one end connected to the fifth electrode.

10. The optical apparatus according to claim 1, wherein in the resin member, a portion that covers a region adjacent to the optical device and a portion that covers a region adjacent to the semiconductor device are made from the same material.

11. The optical apparatus according to claim 1, further comprising a heat dissipating member (i) provided on the back surface of the optical device in the resin member and (ii) penetrating the resin member.

12. The optical apparatus according to claim 11, further comprising
    a first penetrating electrode (i) provided in a more peripheral region of the resin member than the optical device and the semiconductor device, and (ii) electrically connected to the optical device,
    wherein the heat dissipating member has a diameter larger than a diameter of the first penetrating electrode.

* * * * *